United States Patent
Staudinger et al.

(10) Patent No.: US 8,447,245 B2
(45) Date of Patent: May 21, 2013

(54) RADIO FREQUENCY TRANSMITTER HAVING AN AMPLIFIER WITH POWER SUPPLY MODULATION

(75) Inventors: Joseph Staudinger, Gilbert, AZ (US); John M. Pigott, Phoenix, AZ (US); Eric J. Toulouse, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 299 days.

(21) Appl. No.: 12/692,214

(22) Filed: Jan. 22, 2010

(65) Prior Publication Data

US 2011/0183636 A1   Jul. 28, 2011

(51) Int. Cl.
*H04B 1/66* (2006.01)
(52) U.S. Cl.
USPC ................ 455/102; 455/127.1; 330/124 R
(58) Field of Classification Search
USPC ... 455/78, 102, 127.3, 127.4, 127.1; 330/124, 330/136, 149, 151, 226, 286, 296, 297, 306, 330/307, 310, 124 R, 295
See application file for complete search history.

(56) References Cited

U.S. PATENT DOCUMENTS

| | | | |
|---|---|---|---|
| 6,392,483 B2 * | 5/2002 | Suzuki et al. | 330/151 |
| 6,472,934 B1 * | 10/2002 | Pehlke | 330/10 |
| 7,091,772 B2 | 8/2006 | Friedel et al. | |
| 7,336,127 B2 * | 2/2008 | Kennan | 330/124 R |
| 7,427,895 B1 | 9/2008 | Okubo et al. | |
| 7,728,662 B2 * | 6/2010 | Apel | 330/124 R |
| 2004/0183593 A1 * | 9/2004 | Kwon et al. | 330/124 R |
| 2008/0122543 A1 * | 5/2008 | Silver et al. | 330/297 |
| 2010/0188148 A1 * | 7/2010 | Mehta et al. | 330/149 |

FOREIGN PATENT DOCUMENTS

| | | |
|---|---|---|
| EP | 0908006 B1 | 6/2006 |
| WO | 2006055891 A2 | 5/2006 |

* cited by examiner

*Primary Examiner* — Ping Y Hsieh
*Assistant Examiner* — Chung-Tien Yang
(74) *Attorney, Agent, or Firm* — Daniel D. Hill

(57) ABSTRACT

A circuit including a carrier amplifier having an input, an output, a first transistor coupled to a first power supply voltage terminal for receiving a modulated power supply voltage, and a second transistor coupled to a second power supply voltage terminal for receiving a fixed power supply voltage is provided. The circuit further includes a peaking amplifier having an input coupled to the input of the carrier amplifier and an output coupled to the output of the carrier amplifier.

20 Claims, 4 Drawing Sheets

RADIO FREQUENCY TRANSMITTER HAVING AN AMPLIFIER WITH POWER SUPPLY MODULATION

BACKGROUND

1. Field

This disclosure relates generally to radio frequency transmitters, and more specifically, to a radio frequency transmitter having an amplifier with power supply modulation.

2. Related Art

Figure 1:
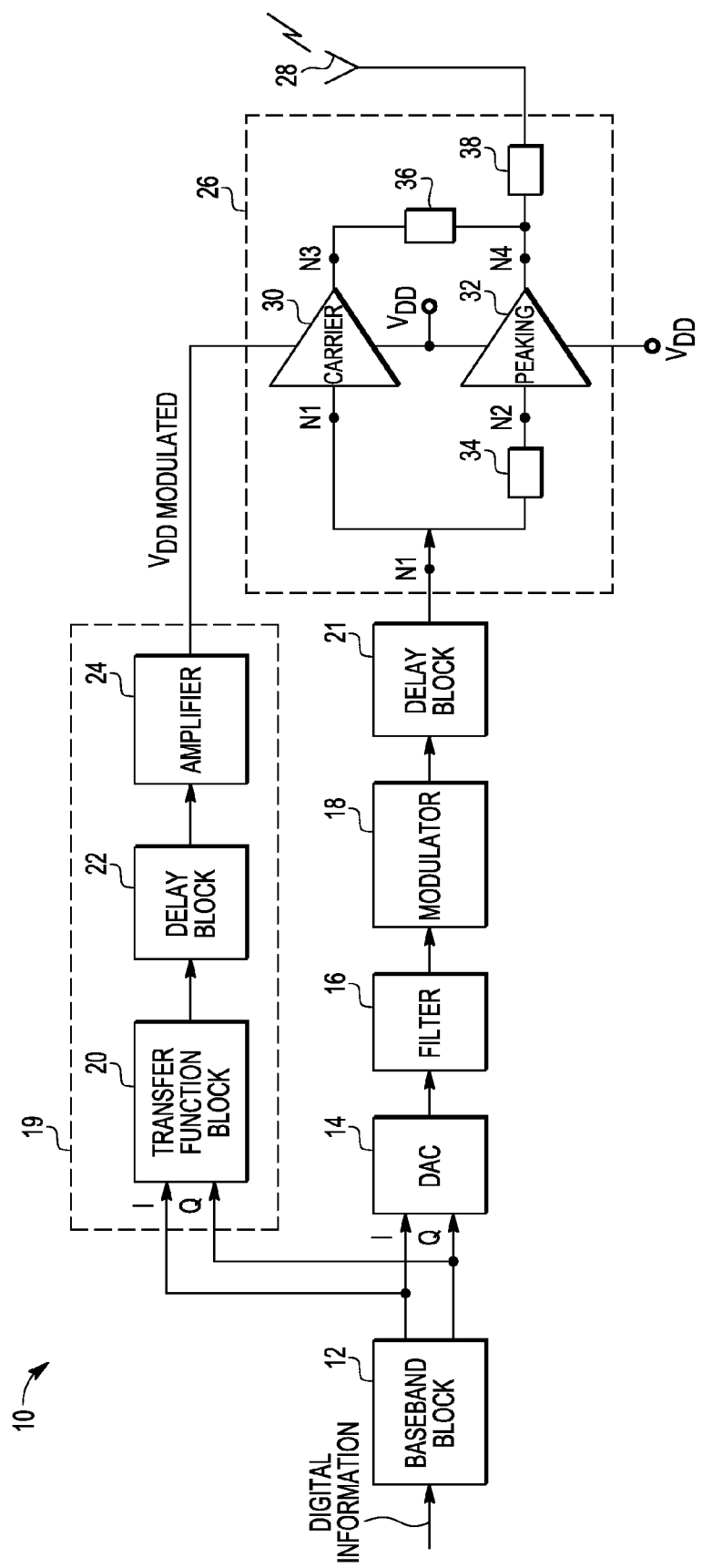

Power amplifiers, such as the ones used in cellular radio frequency transmitters, must satisfy key metrics, including output power, DC-RF efficiency, and linearity. These competing metrics have forced power amplifier designers to use different types of amplifiers, including Doherty amplifiers. The use of basic Doherty amplifiers has resulted in realizing some improvements in key metrics that are demanded by 3G and 4G systems, but further improvements are needed. This is because incremental improvements in metrics, such as the DC-RF efficiency of such amplifiers are needed.

Accordingly, there is a need for improved power amplifiers, including a radio frequency transmitter having an amplifier with power supply modulation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 shows a block diagram of an exemplary radio frequency transmitter having an amplifier;

FIG. 2 shows a schematic diagram of a carrier amplifier of the exemplary radio frequency transmitter of FIG. 1;

FIG. 3 shows a block diagram of another exemplary radio frequency transmitter having an amplifier; and FIG. 4 shows a schematic diagram of a peaking amplifier of the exemplary radio frequency transmitter of FIG. 3.

DETAILED DESCRIPTION

In one aspect, a circuit including a carrier amplifier having an input, an output, a first transistor coupled to a first power supply voltage terminal for receiving a modulated power supply voltage, and a second transistor coupled to a second power supply voltage terminal for receiving a fixed power supply voltage is provided. The circuit further includes a peaking amplifier having an input coupled to the input of the carrier amplifier and an output coupled to the output of the carrier amplifier.

In another aspect, a transmitter including a carrier amplifier having an input, an output, a first power supply voltage terminal coupled to a first transistor for receiving a modulated power supply voltage, and a second transistor coupled to a second power supply voltage terminal for receiving a fixed power supply voltage is provided. The transmitter further includes a peaking amplifier having an input coupled to the input of the carrier amplifier and an output coupled to the output of the carrier amplifier. The transmitter further includes a power supply modulation circuit for modulating the modulated power supply voltage in response to an amplitude of an input signal provided to the transmitter.

In yet another aspect, in a circuit comprising a carrier amplifier and a peaking amplifier, the carrier amplifier having an input, an output, a first transistor, and a second transistor, a first power supply voltage terminal coupled to the first transistor and a second power supply voltage terminal coupled to the second transistor, the peaking amplifier having an input coupled to the input of the carrier amplifier and an output coupled to the output of the carrier amplifier, a method is provided. The method includes receiving an input signal and converting the input signal into in-phase and quadrature signals. The method further includes modulating the in-phase and quadrature signals using a predetermined transfer function to produce a first modulated signal. The method further includes amplifying the first modulated signal to produce an amplified first modulated signal. The method further includes providing the amplified first modulated signal to the first power supply voltage terminal for powering the first transistor. The method further includes providing a fixed power supply voltage to the second power supply voltage terminal for powering the second transistor.

FIG. 1 shows a block diagram of an exemplary radio frequency transmitter 10 having a Doherty amplifier 26. By way of example, radio frequency transmitter 10 may include a baseband block 12, a digital to analog converter (DAC) 14, a filter 16, a modulator 18, and a delay block 21. Baseband block 12 may receive digital information and generate in-phase (I) and quadrature (Q) signals, which then may be converted into an analog form by DAC 14. Filter 16 may filter the analog signals, which then may be modulated using modulator 18. Delay block 21 may be used to delay the output of modulator 18, as needed. Although not shown, as part of this process, analog signals may be mixed with a local oscillator signal, as well. Radio frequency transmitter 10 may further include a power supply modulation circuit 19 and a Doherty amplifier block 26. Power supply modulation circuit 19 may include a transfer function block 20, a delay block 22, and an amplifier 24. Transfer function block 20 may receive I and Q signals and generate a signal corresponding to the envelope of the I and Q signals based on a transfer function. In one embodiment, the transfer relationship between the input I and Q signals and the signal related to the envelope of the I and Q signals may be approximated by a piece-wise linear response. Alternatively, the transfer relationship between the input I and Q signals and the signal related to the envelope of the I and Q signals may be approximated by a continuous function, which may have a first order derivative and possibly higher order derivatives. In one embodiment the transfer function may be related to the square root of the sum of squared I signal and squared Q signal ($I^2+Q^2$). By way of example, transfer function block 20 may be implemented using a look-up table (LUT) and a digital to analog (DAC) converter (not shown). Alternatively, transfer function block 20 may be implemented using an envelope detector. The output of transfer function block 20 may be coupled to delay block 22 that may be used to delay the signal related to the envelope of the I and Q signals, as needed. The delayed signal may then be amplified using amplifier 24 to provide modulated power supply voltage $V_{DD\ MODULATED}$. In one embodiment, amplifier 24 may be implemented using a Class-S modulator. Alternatively, amplifier 24 may be implemented using a DC-DC converter.

With continuing reference to FIG. 1, Doherty amplifier block 26 may include a carrier amplifier 30, a peaking amplifier 32, and transmission lines 34, 36, and 38. The output of Doherty amplifier block 26 may be coupled to an antenna 28 to transmit the amplified RF signals. As shown in FIG. 1, carrier amplifier 30 and peaking amplifier 32 may be connected and operating in Doherty configuration. In one embodiment, carrier amplifier 30 may be biased for Class A/B operation mode and peaking amplifier 32 may be biased in Class C operation mode. A portion of carrier amplifier 30 transistors may be biased with a fixed power supply voltage $V_{DD}$ and another portion of carrier amplifier 30 transistors may be biased with the modulated power supply voltage $V_{DD\ MODULATED}$. In one embodiment, one-half of carrier amplifier 30 transistors may be biased with the fixed power supply voltage $V_{DD}$ and another half of carrier amplifier 30 transistors may be biased with the modulated power supply voltage $V_{DD\ MODULATED}$. When the input signal to radio frequency transmitter 10 is a modulated carrier, such as WDMA or other cellular transmission formats, power supply voltage $V_{DD\ MODULATED}$ is then related to an amplitude of the envelope of the input signal. This is because, as explained above, power supply modulation circuit 19 is used to apply a transfer function to the input signal. In general, the transfer function parameters may be chosen to improve the DC-RF efficiency of Doherty amplifier block 26 at power levels near a point, and below, at which peaking amplifier 32 begins to exhibit a conduction angle >0 (referred to herein as the critical point). A reduction in the magnitude of power supply voltage $V_{DD\ MODULATED}$ to a level below $V_{DD}$ changes the compression characteristics of carrier amplifier 30 leading to higher efficiency. At power levels substantially below the critical point, lowering power supply voltage $V_{DD\ MODULATED}$ significantly below $V_{DD}$ increases the efficiency of carrier amplifier 30, while largely not affecting its output power capability. In addition to affecting the gain characteristics of carrier amplifier 30, the linearity of Doherty amplifier block 26 is also affected. Other characteristics, such as roll off and amplitude modulation to phase modulation conversion, are also affected. Although FIG. 1 shows a specific number of components arranged in a certain manner, radio frequency transmitter 10 may include additional or fewer components arranged differently.

Figure 2:
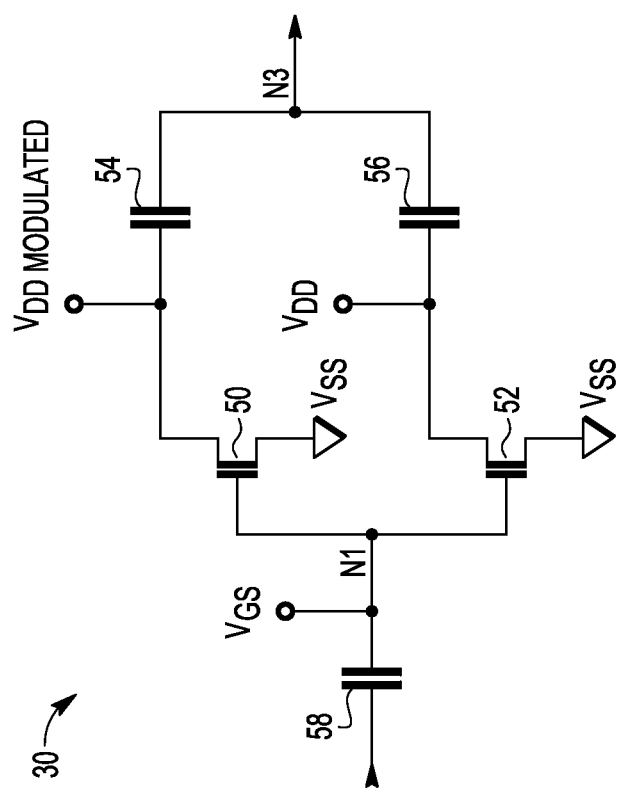

FIG. 2 shows a schematic diagram of a carrier amplifier 30 of the exemplary radio frequency transmitter 10 of FIG. 1. Carrier amplifier 30 may have an input node N1 and an output node N3. Carrier amplifier 30 may include a transistor 50, another transistor 52 and decoupling capacitors 54, 56, and 58. A drain terminal of transistor 50 may be coupled to the modulated power supply voltage $V_{DD\ MODULATED}$ and to output node N3 via decoupling capacitor 54. A control terminal of transistor 50 may be coupled to gate biasing voltage $V_{GS}$ and to the input node N1 via decoupling capacitor 58. A source terminal of transistor 50 may be coupled to ground voltage $V_{SS}$. A drain terminal of transistor 52 may be coupled to the fixed power supply voltage $V_{DD}$ and to the output node N3 via decoupling capacitor 56. A control terminal of transistor 52 may be coupled to gate biasing voltage $V_{GS}$ and to the input node N1 via decoupling capacitor 58. A source terminal of transistor 52 may be coupled to ground voltage $V_{SS}$. Although FIG. 2 shows a specific number of components arranged in a certain manner, carrier amplifier 30 may include additional or fewer components arranged differently.

Figure 3:
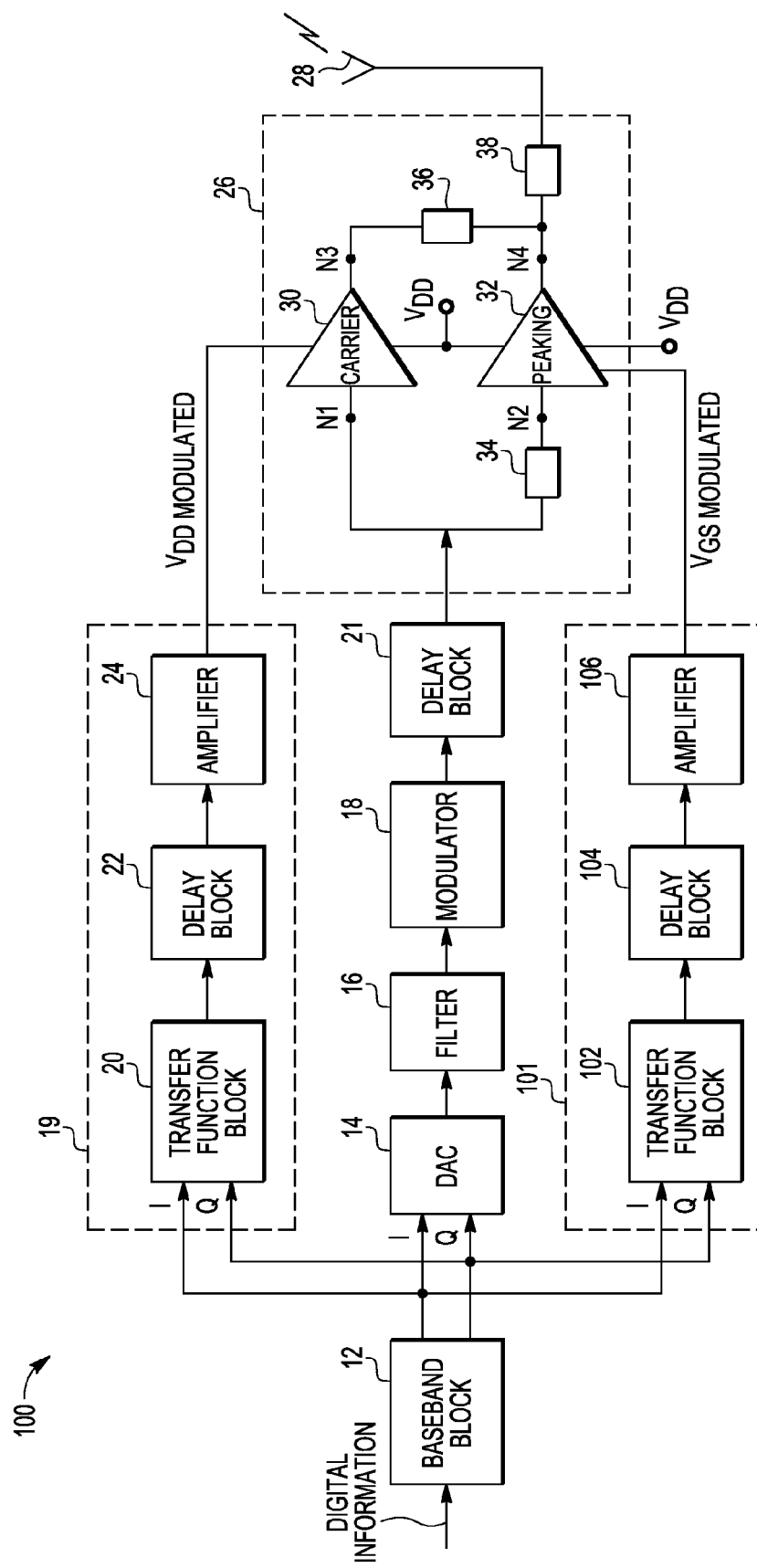

FIG. 3 shows a block diagram of another exemplary radio frequency transmitter 100 having a Doherty amplifier block 26. The components common to FIG. 1 example and FIG. 3 example are not described again. Instead, it is noted that the components in FIG. 3 that have the same reference numerals as the components in FIG. 1 are connected in the same manner as in FIG. 1 and provide the same functionality as described with respect to FIG. 1. Besides the components common with the RF transmitter discussed in FIG. 1, radio frequency transmitter 100 may further include a gate bias modulation circuit 101 to provide a modulated gate bias voltage $V_{GS\ MODULATED}$ to peaking amplifier 32 of Doherty amplifier block 26. Gate bias modulation circuit 101 may include a transfer function block 102, a delay block 104, and an amplifier 106. Transfer function block 102 may receive I and Q signals and generate a signal corresponding to the envelope of the I and Q signals based on a transfer function. In one embodiment, the transfer relationship between the input I and Q signals and the signal related to the envelope of the I and Q signals may be approximated by a piece-wise linear response. Alternatively, the transfer relationship between the input I and Q signals and the signal related to the envelope of the I and Q signals may be approximated by a continuous function, which may have a first order derivative and possibly higher order derivatives. In one embodiment the transfer function may be related to the square root of the sum of squared I signal and squared Q signal ($I^2+Q^2$). By way of example, transfer function block 102 may be implemented using a look-up table (LUT) and a digital to analog (DAC) converter (not shown). Alternatively, transfer function block 102 may be implemented using an envelope detector. The output of transfer function block 102 may be coupled to delay block 104 that may be used to delay the signal related to the envelope of the I and Q signals, as needed. The delayed signal may then be amplified using amplifier 104 to provide modulated gate bias voltage $V_{GS}$ MODULATED. In one embodiment, amplifier 104 may be implemented using an analog amplifier.

With continuing reference to FIG. 3, Doherty amplifier block 26 may include a carrier amplifier 30, a peaking amplifier 32, and transmission lines 34, 36, and 38. The output of Doherty amplifier block 26 may be coupled to an antenna 28 to transmit the amplified RF signals. As in the Doherty amplifier block 26 shown in FIG. 1, carrier amplifier 30 and peaking amplifier 32 may be connected and operating in Doherty configuration. In one embodiment, carrier amplifier 30 may be biased for Class A/B operation mode and peaking amplifier 32 may be biased in Class C operation mode. A portion of carrier amplifier 30 transistors may be biased with a fixed power supply voltage $V_{DD}$ and another portion of carrier amplifier 30 transistors may be biased with the modulated power supply voltage $V_{DD\ MODULATED}$. In one embodiment, one-half of carrier amplifier 30 transistors may be biased with the fixed power supply voltage $V_{DD}$ and another half of carrier amplifier 30 transistors may be biased with the modulated power supply voltage $V_{DD\ MODULATED}$. In addition, carrier amplifier 30 may be biased using a fixed gate bias voltage $V_{GS}$, whereas peaking amplifier 32 may be biased using a modulated gate bias voltage $V_{GS\ MODULATED}$. Although FIG. 3 shows a specific number of components arranged in a certain manner, radio frequency transmitter 100 may include additional or fewer components arranged differently.

Figure 4:
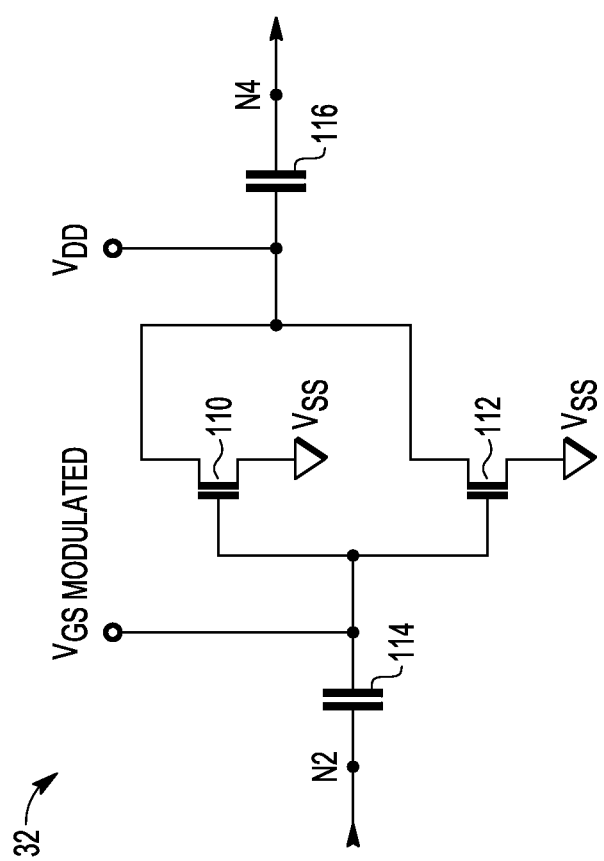

FIG. 4 shows a schematic diagram of peaking amplifier 32 of the exemplary radio frequency transmitter 100 of FIG. 3. Peaking amplifier 32 may have an input node N2 and an output node N4. Peaking amplifier 32 may include a transistor 110, another transistor 112 and decoupling capacitors 114 and 116. A drain terminal of transistor 110 may be coupled to the fixed power supply voltage $V_{DD}$ and to output node N4 via decoupling capacitor 116. A control terminal of transistor 110 may be coupled to modulated gate bias voltage $V_{GS\ MODULATED}$ and to the input node N2 via decoupling capacitor 114. A source terminal of transistor 110 may be coupled to ground voltage $V_{SS}$. A drain terminal of transistor 112 may be coupled to the fixed power supply voltage $V_{DD}$ and to the output node N4 via decoupling capacitor 116. A control terminal of transistor 112 may be coupled to modulated gate bias voltage $V_{GS\ MODULATED}$ and to the input node N2 via decoupling capacitor 114. A source terminal of transistor 112 may be coupled to ground voltage $V_{SS}$. Although FIG. 4 shows a specific number of components arranged in a certain manner, peaking amplifier 32 may include additional or fewer components arranged differently.

By now it should be appreciated that there has been provided methods and circuits having an amplifier with power supply modulation. Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
a carrier amplifier having an input, an output, a first transistor coupled to a first power supply voltage terminal for receiving a modulated power supply voltage, and a second transistor coupled to a second power supply voltage terminal for receiving a fixed power supply voltage; and
a peaking amplifier having an input coupled to the input of the carrier amplifier and an output coupled to the output of the carrier amplifier.

2. The circuit of claim 1 further comprising a power supply modulation circuit for providing the modulated power supply voltage in response to an envelope of an input signal provided to the circuit.

3. The circuit of claim 2, wherein the power supply modulation circuit further comprises an envelope detector.

4. The circuit of claim 2 further comprising:
a baseband block for providing the input signal as in-phase and quadrature signals;
and wherein the power supply modulation circuit comprises:
a transfer function block for applying a transfer function to the in-phase and quadrature signals to produce an envelope signal corresponding to the envelope of the in-phase and quadrature signals;
a digital-to-analog converter for converting the envelope signal to an analog signal; and
an amplifier coupled to receive the analog signal, and in response, to provide the modulated power supply voltage.

5. The circuit of claim 4, wherein the transfer function block comprises a look-up table.

6. The circuit of claim 4, wherein the transfer function is approximated by a piece-wise linear response to produce the envelope signal.

7. The circuit of claim 4, wherein the amplifier is further characterized as being one of a class S modulator or a DC-DC converter.

8. The circuit of claim 1, wherein the first power supply voltage terminal is coupled to a drain of the first transistor, and the second power supply voltage terminal is coupled to a drain of the second transistor.

9. The circuit of claim 1 further comprising a gate bias modulation circuit for providing a modulated gate bias voltage to bias a transistor of the peaking amplifier in response to the input signal provided to the circuit.

10. The circuit of claim 9, further comprising:
a baseband block for providing the input signal as in-phase and quadrature signals;
and wherein the gate bias modulation circuit comprises:
a transfer function block, for applying a transfer function to the in-phase and quadrature signals to produce an envelope signal corresponding to the envelope of the in-phase and quadrature signals;
a digital-to-analog converter for converting the envelope signal to an analog signal; and
an amplifier coupled to receive the analog signal, and in response, providing the modulated gate bias voltage.

11. A transmitter comprising:
a carrier amplifier having an input, an output, a first power supply voltage terminal coupled to a first transistor for receiving a modulated power supply voltage, and a second transistor coupled to a second power supply voltage terminal for receiving a fixed power supply voltage;
a peaking amplifier having an input coupled to the input of the carrier amplifier and an output coupled to the output of the carrier amplifier; and
a power supply modulation circuit for producing the modulated power supply voltage in response to an input signal provided to the transmitter.

12. The transmitter of claim 11, wherein the power supply modulation circuit further comprises an envelope detector.

13. The transmitter of claim 11 further comprising:
a baseband block for providing the input signal as in-phase and quadrature signals;
and wherein the power supply modulation circuit comprises:
a transfer function block for applying a transfer function to the in-phase and quadrature signals to produce an envelope signal corresponding to an envelope of the in-phase and quadrature signals;
a digital-to-analog converter for converting the envelope signal to an analog signal; and an amplifier coupled to receive the analog signal, and in response, to provide the modulated power supply voltage.

14. The transmitter of claim 11 further comprising a gate bias modulation circuit for providing a modulated gate bias voltage to bias a transistor of the peaking amplifier in response to the input signal provided to the transmitter.

15. The transmitter of claim 14 further comprising:
a baseband block for providing the input signal as in-phase and quadrature signals;
and wherein the gate bias modulation circuit comprises:
a transfer function block, for applying a transfer function to the in-phase and quadrature signals to produce an envelope signal corresponding to the envelope of the in-phase and quadrature signals;
a digital-to-analog converter for converting the envelope signal to an analog signal; and
an amplifier coupled to receive the analog signal, and in response, providing the modulated gate bias voltage.

16. In a circuit comprising a carrier amplifier and a peaking amplifier, the carrier amplifier having an input, an output, a first transistor, and a second transistor, the peaking amplifier having an input coupled to the input of the carrier amplifier and an output coupled to the output of the carrier amplifier, a method comprising:
receiving an input signal;
converting the input signal into in-phase and quadrature signals;
producing a first envelope signal by applying a first predetermined transfer function to the in-phase and quadrature signals;
amplifying the first envelope signal to produce an amplified first signal;
providing the amplified first signal to a first power supply voltage terminal coupled to the first transistor for powering the first transistor; and
providing a fixed power supply voltage to a second power supply voltage terminal coupled to the second transistor for powering the second transistor.

17. The method of claim 16 further comprising:
producing a second envelope signal by applying a second predetermined transfer function to the in-phase and quadrature signals;
amplifying the second envelope signal to produce an amplified second signal; and
providing the amplified second signal to bias a transistor gate of the peaking amplifier.

18. The method of claim 16, wherein producing the first envelope signal comprises squaring an amplitude of each of the in-phase and quadrature signals and summing the squared amplitudes.

19. The method of claim 16, wherein amplifying the first signal to produce an amplified first signal further comprises amplifying the first signal using one of either a class S modulator or a DC-DC converter.

20. The method of claim 16, wherein the method is implemented in a transmitter.

* * * * *